United States Patent
Yoon et al.

(10) Patent No.: US 7,123,114 B2
(45) Date of Patent: Oct. 17, 2006

(54) SWITCHABLE COMBINER AND INTEGRATED COMBINING APPARATUS FOR USING IT

(75) Inventors: Young-Sang Yoon, Gyeonggi-do (KR); Chan-huk Jung, Incheon (KR); Jung-Hak Ahn, Gyeonggi-do (KR); Chang-Hwan Kim, Seoul (KR); Hyun-Taek Kang, Gyeonggi-do (KR)

(73) Assignee: Ace Technology, Incheon (KR)

( * ) Notice: Subject to any disclaimer, the term of this patent is extended or adjusted under 35 U.S.C. 154(b) by 11 days.

(21) Appl. No.: 10/504,920

(22) PCT Filed: Jul. 25, 2002

(86) PCT No.: PCT/KR02/01400

§ 371 (c)(1),
(2), (4) Date: Aug. 18, 2004

(87) PCT Pub. No.: WO03/069719

PCT Pub. Date: Aug. 21, 2003

(65) Prior Publication Data

US 2005/0088253 A1    Apr. 28, 2005

(30) Foreign Application Priority Data

Feb. 18, 2002    (KR) .................... 20-2002-0004818

(51) Int. Cl.
*H01P 1/10*    (2006.01)
*H01P 5/12*    (2006.01)

(52) U.S. Cl. .................. 333/101; 333/104; 333/125
(58) Field of Classification Search ............. 333/101, 333/103, 104, 105, 125
See application file for complete search history.

(56) References Cited

U.S. PATENT DOCUMENTS

| | | | |
|---|---|---|---|
| 5,872,491 A | | 2/1999 | Kim et al. |
| 6,097,266 A | * | 8/2000 | Nardozza et al. ............ 333/101 |
| 6,587,013 B1 | * | 7/2003 | Arlin et al. ............... 333/101 |
| 6,952,586 B1 | * | 10/2005 | Kim et al. ................ 455/452.1 |

FOREIGN PATENT DOCUMENTS

| | | |
|---|---|---|
| JP | 2001-156509 | 6/2001 |
| KR | 2001-0113302 | 12/2001 |

* cited by examiner

*Primary Examiner*—Dean Takaoka
(74) *Attorney, Agent, or Firm*—Venable LLP; Michael A. Sartori

(57) ABSTRACT

A switchable combiner and apparatus for providing intergrated combiner unit, which can reduce problem due to frequent substitution of unit. The apparatus for providing intergrated combiner unit includes the means of; a) dividing input signal according to basic type, redundancy type or power division/coupling type; b) switching the transmitted signal to power amplifier; c) switching the transmitted signal to the means of combining; and d) combining the transmitted signal according to basic type, redundancy type or power division/coupling type.

9 Claims, 9 Drawing Sheets

SWITCHABLE COMBINER AND INTEGRATED COMBINING APPARATUS FOR USING IT

TECHNICAL FIELD

The present invention relates to a switchable combiner and an integrated combining apparatus using the switchable combiner; and, more particularly, to a switchable combiner used in a transmission system of a base station in a mobile communication system, and an integrated combining apparatus using the switchable combiner.

BACKGROUND ART

Cost is one of the factors that determines the quality of service in the operation of a base station. When the number of subscribers is small in the initial days, a base station uses a basic type of switchable combiner or a redundancy type of switchable combiner.

FIGS. 1A and 1B are schematic diagrams describing conventional basic and redundancy-type switchable combiners, respectively. As shown in the drawings, the conventional basic and redundancy-type switchable combiners include a plurality of power amplifiers 110, input ports 120 and output ports 130. In the basic-type combiner of FIG. 1A, the inputs and outputs of the power amplifier 110 are connected one to one to each other with a radio frequency (RF) cable so that an input should be corresponded to an output.

The redundancy-type switchable combiner, as shown in FIG. 1B, has 4:3 switches in the input and output ports 120 and 130. Therefore, even though one of the three power amplifiers 111, 113 and 115 performs malfunction, the base station can be operated normally without being broken down by switching on a route to a redundancy amplifier 116.

In FIG. 1B, the power amplifiers 111, 113 and 115 perform normal operation and the switches A, B and C are turned on among the 4:3 switches of the input and output ports 120 and 130. The switches A, B and C transmit an RF signal to the out ports 131, 133 and 135.

If one of the power amplifiers 111, 113 and 115 performs malfunction, for example, the power amplifier 113 is assumed to perform malfunction, the switch B corresponding to the power amplifier 113 is turned off at the same time, and it is connected to a redundancy port E. Thus, the reserve power amplifier 116 is operated to maintain the system normal. In this manner, when the combiner is operated in the redundancy type, only three input and output ports are used.

The basic and redundancy types of switchable combiners can be used in the early days when the number of subscribers is small. However, when the number of subscribers becomes large, these types of switchable combiners cannot be used any more due to the low transmission power. To solve this problem, a power dividing/coupling type of switchable combiner is used to increase the transmission power suitably for the increased number of subscribers.

FIG. 1C shows a conventional power dividing/coupling type of switchable combiner. As illustrated in the drawing, the conventional power dividing/coupling type of switchable combiner includes a plurality of power amplifiers 110, a switchable divider 140 and a switchable combiner 150, and the switchable combiner 150 sums up the outputs of two power amplifiers. Therefore, it can produce an output power twice as high as it used to produce with one power amplifier, whereby it can deal with the increased subscribers. However, if a base station uses a basic-type combiner of FIG. 1A or a redundancy-type combiner of FIG. 1B in the initial time and then when the number of subscribers is increased, adopts a power dividing/coupling-type combiner of FIG. 1C to accommodate more channel for the increased subscriber, the cost for changing the combiner becomes a burden on the system operator.

Meanwhile, the switchable combiner 150 is a two-way switchable combiner. When both of the switches A and B are power-on, the switchable combiner 150 is operated in two ways. Otherwise, when only one switch of them is power-on, the switchable combiner 150 is operated in one way.

FIG. 2 is a schematic diagram describing a conventional switchable combiner adopting an average matching method. As shown in the drawing, the conventional switchable combiner is what a switching function is added to a Wilkinson divider. The conventional switchable combiner is operated as described below.

Signals inputted to the input ports $P_{in1}$ and $P_{in2}$ are outputted through average matching lines 210 to an output port $P_{out}$. Here, the inputted signals receive a control signal for controlling the number of power amplifiers to be operated in the base station system, and determine to operate the combiner in one way or two ways based on the number of power amplifiers determined to be operated above.

Accordingly, when two power amplifiers are operated in the base station system, it means that the switches $S_{11}$ and $S_{21}$ and the switches $S_{12}$ and $S_{22}$ of the switchable combiner are power-on simultaneously and the switchable combiner is operated as a two-way combiner. When one power amplifier connected to the input port $P_{in1}$ is operated, it means that the switches $S_{11}$ and $S_{21}$ of the switchable combiner are power-on, and the other switches $S_{12}$ and $S_{22}$ become power-off. Thus, the switchable combiner is operated as a one-way combiner. Here, impedance $Z_m$ of the average matching line 210 is a value between the one-way combination and the two-way combination, and it is obtained from Equation 1 below.

$$Z_m = \frac{Z_0}{2}(\sqrt{2} + \sqrt{1}) \qquad \text{Eq. 1}$$

However, the above average matching method raises a serious problem that reflection loss and insertion loss are increased.

DISCLOSURE OF INVENTION

It is, therefore, an object of the present invention to provide a switchable combiner that can minimize route-based insertion loss by setting up a matching unit for two-way combination and then using an open stub and a short stub for the combination of the other route numbers.

It is another object of the present invention to provide an integrated combining apparatus using a switchable combiner that can relieve the burden of additional installation of combiner, which is caused by the increase in subscribers, by accommodating all the functions of basic, redundancy and power dividing/coupling-type combiners.

In accordance with one aspect of the present invention, there is provided a switchable combiner for minimizing route-based disparity in insertion loss, including: first and second input ports for transmitting inputted signals; first and second lines connected to the first and second input ports, respectively, for transmitting the inputted signals; a common contact point for combining the signals transmitted from the first and second lines; first and second switching unit for switching the common contact point with the first and second lines based on the number of routes; a third line for receiving a signal outputted from the common contact point and transmitting the signal to an output port; the output port for outputting the signal transmitted from the third line; a third switching unit for switching the third line and a short stub; an open stub connected to the third line for setting up matching condition with respect to the maximum route number; and the short stub for performing matching with respect to the route numbers other than the maximum route number.

In accordance with one aspect of the present invention, there is provided an integrated combining apparatus using the switchable combiner, which can be used in a basic, redundancy or power dividing/coupling type to control the signals outputted from a plurality of power amplifiers, including: a plurality of switchable dividers for dividing an inputted signal based on the basic, redundancy or power dividing/coupling type of combiner; a first N:N switching unit (N being an integer) for receiving signals outputted from the switchable dividers and transmitting the signals to the power amplifiers; a second N:N switching unit (N being an integer) for receiving signals outputted from high power amplifiers and transmitting the signals to the switchable combiners; and the plurality of switchable combiners for receiving signals outputted from the second N:N switching unit and combining the signals based on the basic, redundancy or power dividing/coupling type of combiner.

BRIEF DESCRIPTION OF DRAWINGS

The above and other objects and features of the present invention will become apparent from the following description of the preferred embodiments given in conjunction with the accompanying drawings, in which.

BEST MODE FOR CARRYING OUT THE INVENTION

Other objects and aspects of the invention will become apparent from the following description of the embodiments with reference to the accompanying drawings, which is set forth hereinafter.

(1st Embodiment)

Figure 1A:
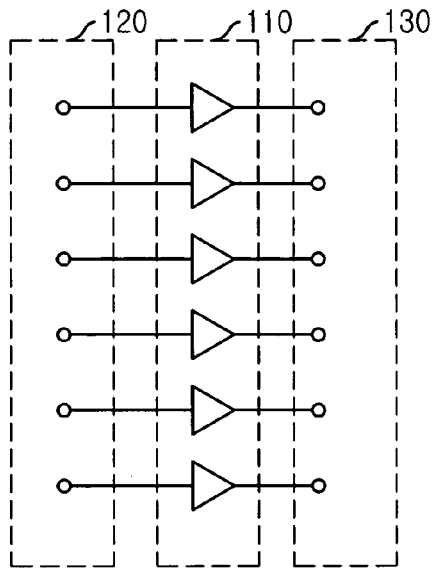
FIG. 1A is a schematic diagram describing a conventional basic type of switchable combiner.
Figure 1B:
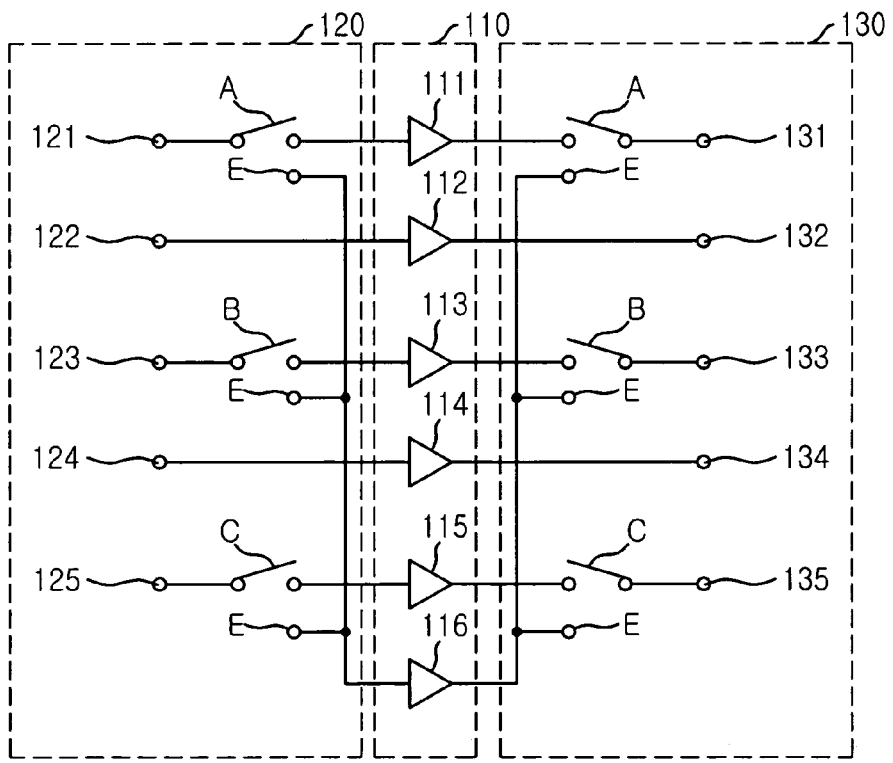
FIG. 1B is a schematic diagram illustrating a conventional redundancy type of switchable combiner.
Figure 1C:
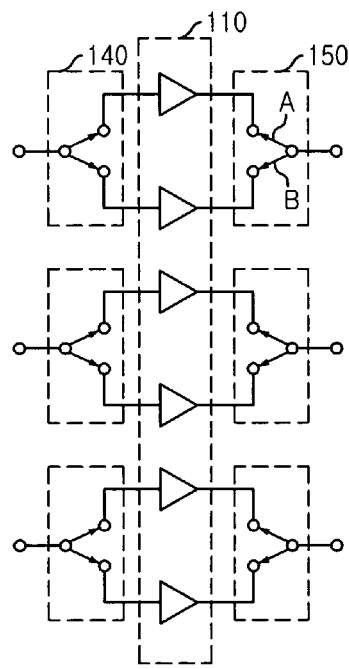
FIG. 1C is a schematic diagram showing a conventional power dividing/coupling type of switchable combiner.
Figure 2:
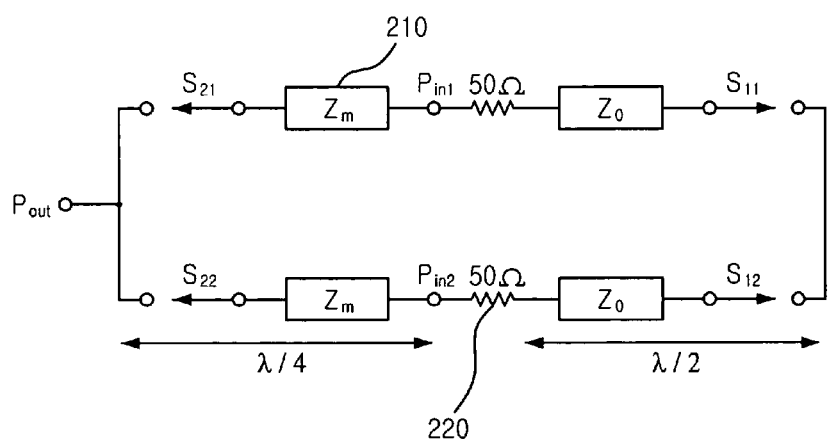
FIG. 2 is a schematic diagram describing a conventional switchable combiner.
Figure 3:
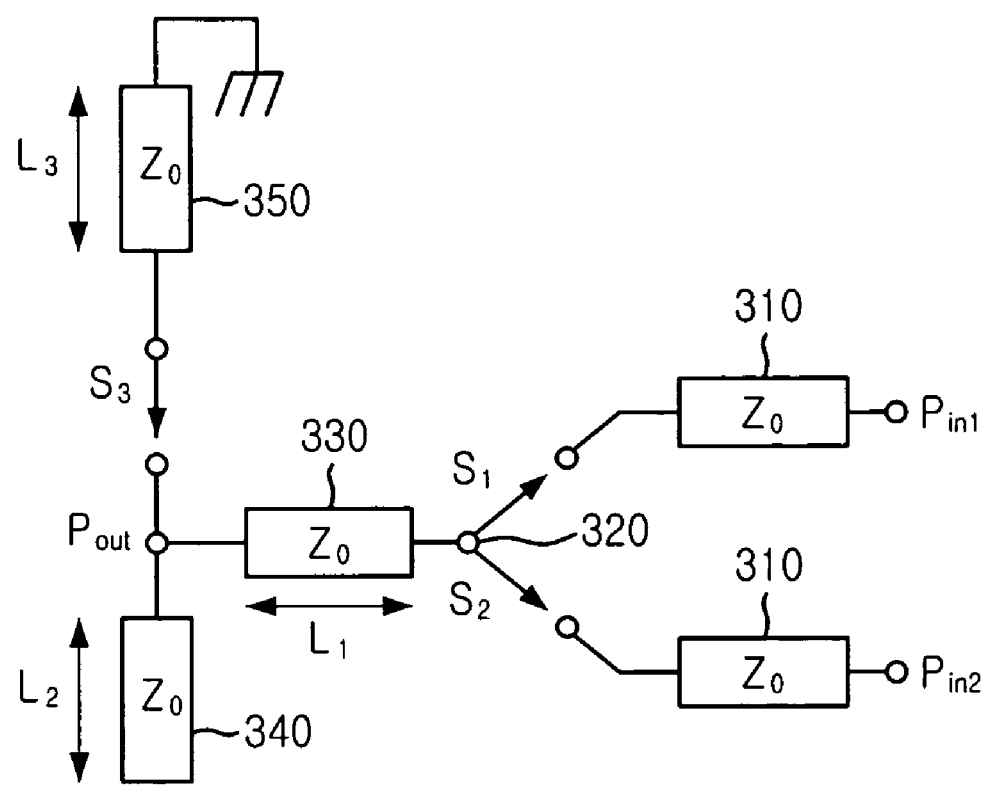
FIG. 3 is a schematic diagram depicting a switchable combiner in accordance with an embodiment of the present invention.

FIG. 3 is a schematic diagram depicting a switchable combiner in accordance with an embodiment of the present invention. As illustrated in the drawing, the switchable combiner of the present invention includes first lines 310, a common contact point 320, a second line 330, an open stub 340 and a short stub 350. It further includes first and second input ports $P_{in1}$, and $P_{in2}$, an output port $P_{out}$, and switches $S_1$, $S_2$ and $S_3$.

When the number of routes is two, signals are inputted to the first and second input ports $P_{in1}$, and $P_{in2}$, and thus the switches $S_1$ and $S_2$ become power-on. The inputted signals are transmitted through the first lines 310, and combined in the common contact point 320. Here, the second line 330 and the open stub 340 are connected to each other always. This minimizes the route-based disparity in insertion loss by setting up matching conditions first with respect to the combination of the maximum route number, i.e., two-way combination, and then perform matching with respect to the combination of the other route numbers using the short stub 350. It also improves the phase disparity between the input ports.

The lengths of the second line 330 and the open stub 340 play an important role in the impedance matching of two-way combination. The electric length $L_1$ of the second line 330 can be obtained from Equation 2 shown below.

$$L_1[deg] = \tan^{-1} t, \quad t = \frac{X_L \pm \sqrt{R_L[(Z_0 - R_L)^2 + X_L^2]/Z_0}}{R_L - Z_0} \quad \text{Eq. 2}$$

Here, when $Z_0=50$, $X_L=0$, and $R_L=25\Omega$ (since it is two-way combination, 50/2=25Ω), $L_1$ comes to 34.89 deg.

The physical length of the transmission line may be different based on the dielectric constant of a dielectric substance included in the transmission line. When air, whose dielectric constant is 1, is used as a dielectric substance, and the frequency in use is 1,855 MHz, the actual physical length becomes around 16 mm.

Figure 4A:
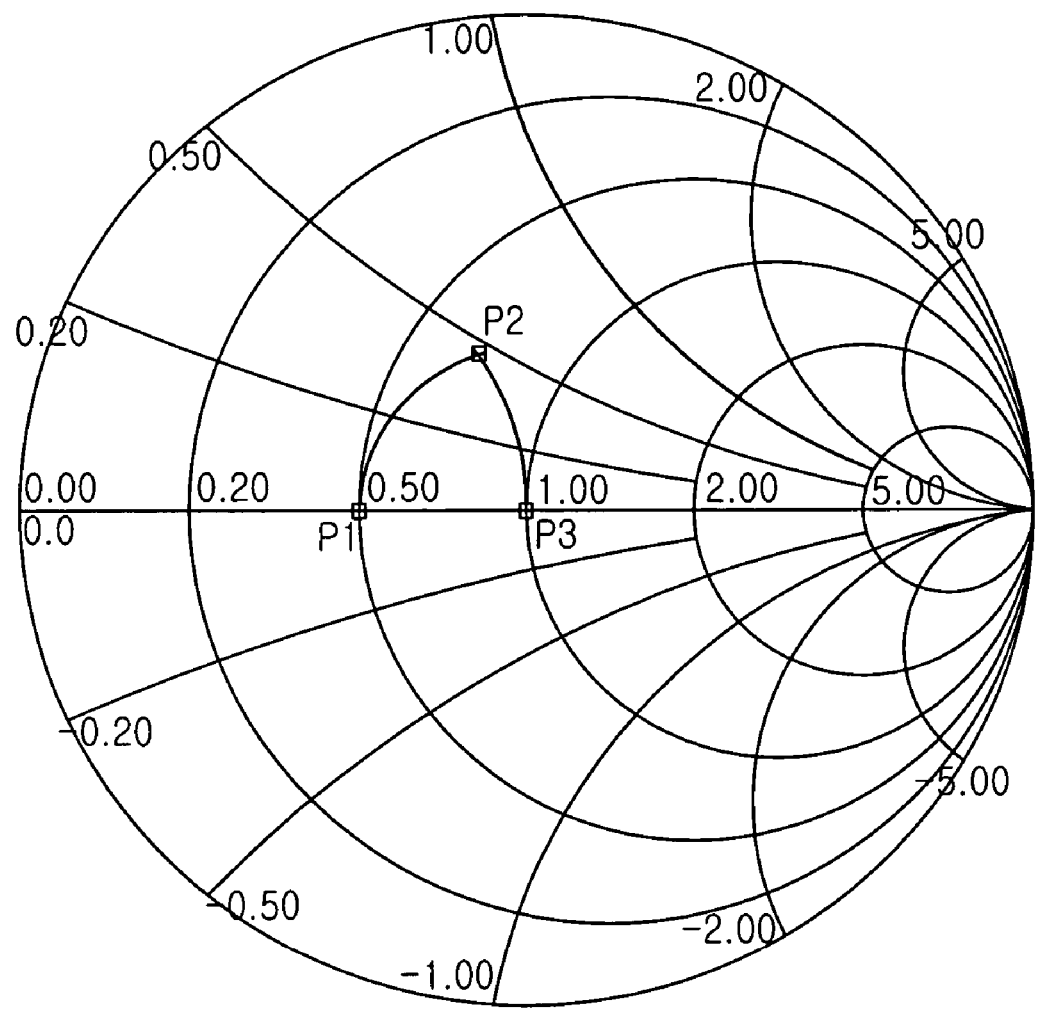
FIG. 4A is a diagram illustrating impedance of two-way combination, shown in FIG. 3, in accordance with the embodiment of the present invention.

With reference to FIG. 4A, impedance of the second line 330 is described herein. It uses the length $L_1$ obtained from Equation 2.

FIG. 4A is a diagram illustrating impedance of two-way combination, shown in FIG. 3, in accordance with the embodiment of the present invention. Pi having an impedance of 25Ω is marked in a Smith chart first, and then it is moved onto a transmission line having an impedance of 50Ω as much as the length $L_1$ ($L_1$=34.89 deg), which is a point $P_2$.

The electric length $L_2$ of the open stub 340 can be calculated from Equation 3 below.

$$L_2[deg] = \tan^{-1}\left(\frac{B_0}{Y_0}\right), \quad B = \frac{R_L^2 t - (Z_0 - X_L t)(X_L + Z_0 t)}{Z_0[R_L^2 + (X_L + Z_0 t)^2]}, \quad B_0 = -B \quad \text{Eq. 3}$$

Here, B denotes a susceptance and $B_0$ stands for a susceptance of the stub. Therefore, the electric length $L_2$ of the open stub 340 is obtained to be 34.89 deg ($L_2$=34.89 deg) from Equation 3, when $Z_0$=50, $X_L$=0, and $R_L$=25 Ω. If the dielectric constant is 1 and the frequency in use is 1,855 MHz, the actual physical length is about 16 mm.

When the point $P_2$, which is moved by the second line 330 in FIG. 4A, is moved as much as the length $L_2$ (=34.89 deg), it becomes a point $P_3$. This way, the impedance of the open stub 340 is matched.

Meanwhile, when the number of routes to be combined is one way and a signal is inputted to the first input port $P_{in1}$, the switch $S_1$ becomes power-on and the switch $S_2$ becomes power-off. Therefore, the signal is transmitted through the first line 310 alone, which is connected to the first input port $P_{in1}$.

The second line 330 and the open stub 340 are connected to each other always. This is to minimize the route-based disparity in insertion loss and improve the phase disparity between input ports by setting up a matching condition first with respect to the maximum route number, i.e., two-way, and performing matching on the combination of the other route numbers using the short stub 350.

In case of one-way combination, the switch $S_3$ is power-on for impedance matching and the short stub 350 is grounded. The lengths of the second line 330 and the open stub 340 are as described above, and the electric length $L_3$ of the short stub 350 can be obtained from Equation 4 below.

$$L_3[deg] = -\tan^{-1}\left(\frac{Y_0}{B_S}\right), B = \frac{R_L^2 t - (Z_0 - X_L t)(X_L + Z_0 t)}{Z_0[R_L^2 + (X_L + Z_0 t)^2]}, B_S = -B \quad \text{Eq. 4}$$

Here, B denotes a susceptance and $B_S$ stands for a susceptance of the short stub. Therefore, the electric length $L_3$ of the short stub 350 shown in FIG. 3 is obtained to be 50.9 deg ($L_3$=50.9 deg) from Equation 4. If the dielectric constant is 1 and the frequency in use is 1,855 MHz, the actual physical length is about 23.5 mm.

Figure 4B:
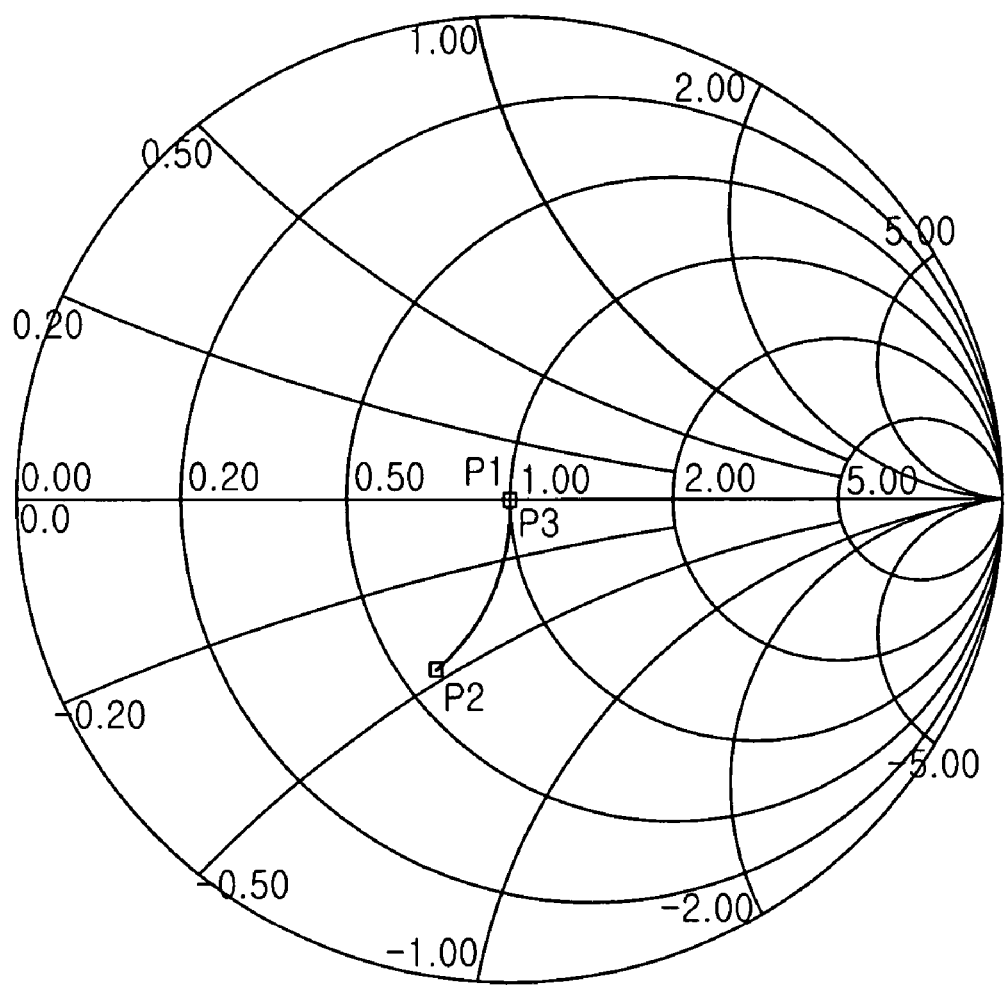
FIG. 4B is a diagram showing impedance of one-way combination, shown in FIG. 3, in accordance with the embodiment of the present invention.

FIG. 4B is a diagram showing an impedance of one-way combination, shown in FIG. 3, in accordance with the embodiment of the present invention. First, a point $P_1$ having an impedance of 50 Ω is marked on the Smith chart, and then moved as much as the length $L_3$ ($L_3$=50.9 deg), which becomes a point $P_2$.

When the switch $S_3$ is turned on and the short stub is grounded, the point $P_2$ is moved back to the point $P_1$ (=$P_3$) whose impedance is 50 Ω. This way, impedance is matched with respect to the short stub. Here, the actual physical lengths $l_{L1}$, $l_{L2}$ and $l_{L3}$ obtained from the electric lengths $L_1$, $L_2$ and $L_3$ expressed as degree, i.e., deg, are different depending on the frequency band in use. The weighting factor with respect to the frequency factor corresponding thereto can be determined from Equation 5 shown below.

$$l_{L1} = \frac{\lambda L_1}{360}, l_{L2} = \frac{\lambda L_2}{360}, l_{L3} = \frac{\lambda L_3}{360} \left(\lambda = \frac{c}{\sqrt{\varepsilon_r f}}\right) \quad \text{Eq. 5}$$

where $\varepsilon_r$ is a dielectric constant of a dielectric substance included in the transmission line.

Although the present invention describes a two-way switchable combiner, it will be obvious to those skilled in the art that the present invention is not limited to a two-way combination, but it can be extended or applied diversely based on the technological concept by varying the length of the open stub and/or short stub based on Equation 2 to 4.

The switchable combiner of the present invention can minimize the route-based disparity in insertion loss by setting up a matching unit first with respect to a two-way combination, and then for the combination of the other route numbers, controlling the combination using the open stub and/or short stub. It can also improve the phase disparity between input ports by setting up a matching unit first with respect to a two-way combination, and then for the combination of the other route numbers, controlling the combination using the open stub and/or short stub.

(2$^{nd}$ Embodiment)

An integrated combining apparatus using a switchable combiner of the present invention is described herein in accordance with another embodiment of the present invention.

Figure 5:
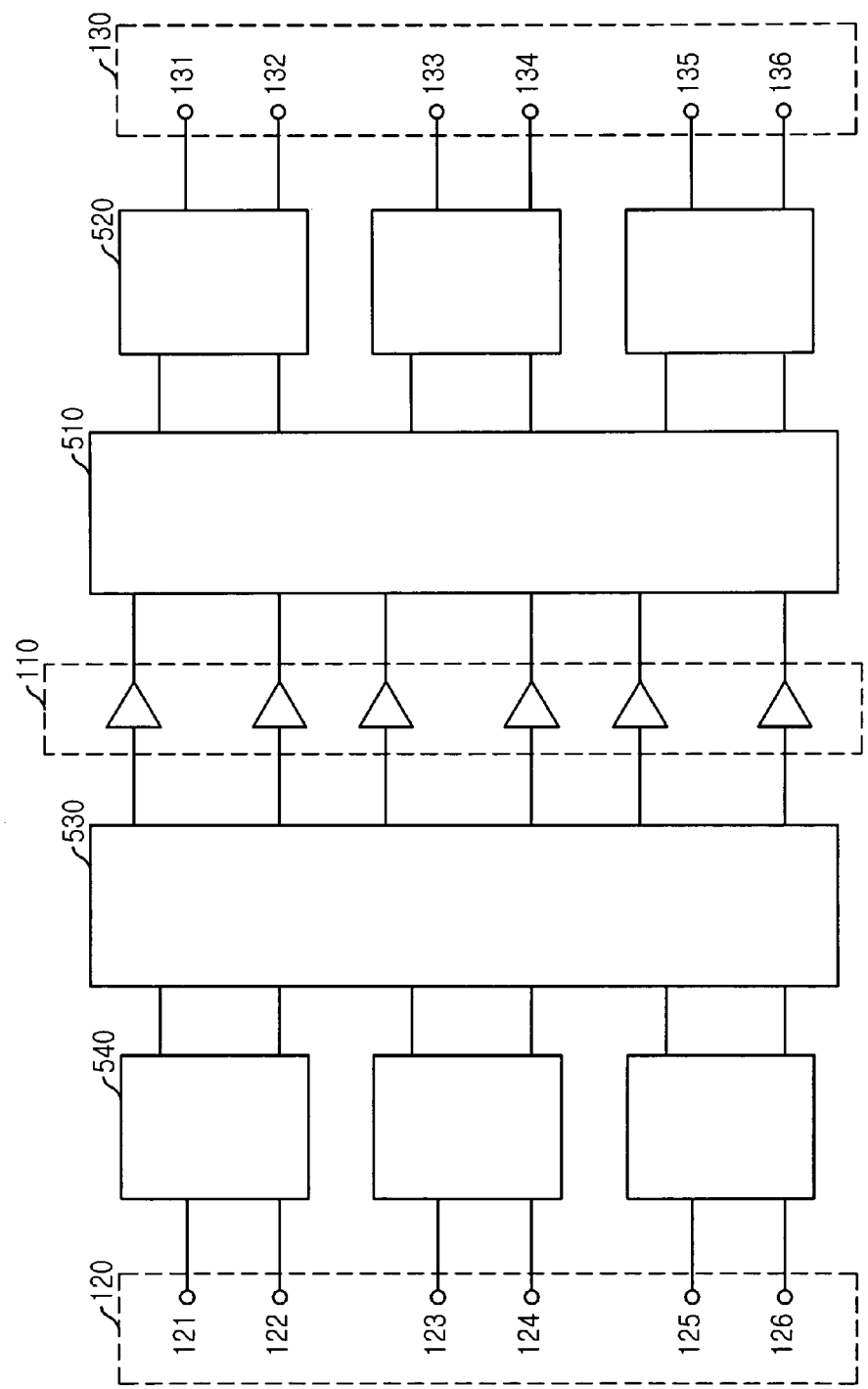
FIG. 5 is a schematic diagram showing an integrated combining apparatus using a switchable combiner in accordance with another embodiment of the present invention.

FIG. 5 is a schematic diagram showing an integrated combining apparatus using a switchable combiner in accordance with another embodiment of the present invention. As shown in the drawing, the combining apparatus of the present invention includes a plurality of power amplifiers 110, an output 4:4 switch 510, a switchable combiner 520, an input 4:4 switch 530, and a switchable divider 540.

The switchable combiner 520 is the same as described above with reference to FIG. 3, and the switchable divider 540 used here is a conventional low-power switching divider using a pin diode. So, further detailed description on them will be omitted herein. Also, since it is obvious to those skilled in the art the present invention belongs to that the output 4:4 switch 510, switchable combiner 520, input 4:4 switch 530, and the switchable divider 540 are operated by direct current supplied thereto and switched by an external control signal, any description on them will be omitted herein, too.

Figure 6A:
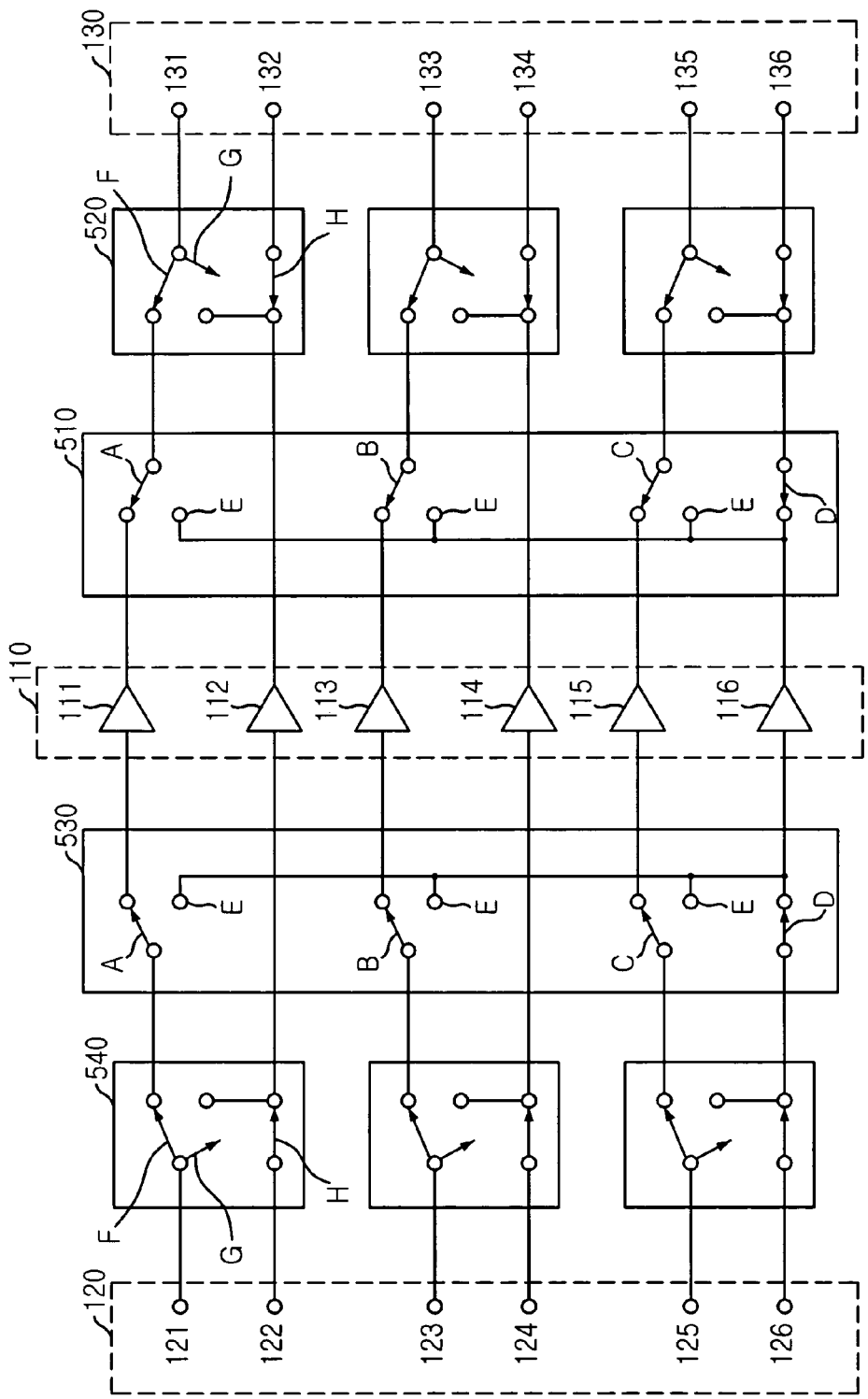
FIG. 6A is a schematic diagram describing a basic-type operation of the integrated combining apparatus of FIG. 5.
Figure 6B:
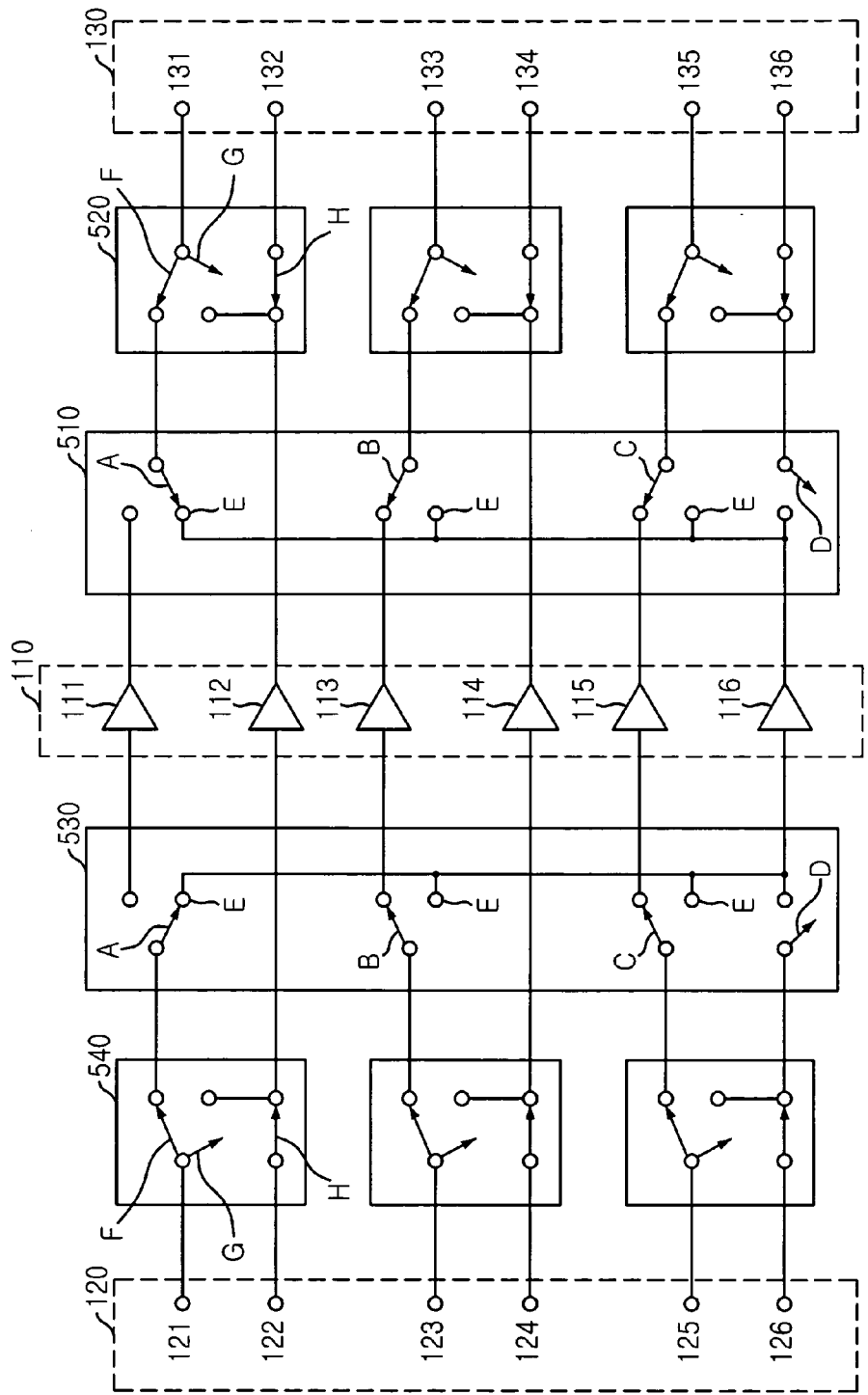
FIG. 6B is a schematic diagram showing a redundancy-type operation of the integrated combining apparatus of FIG. 5.
Figure 6C:
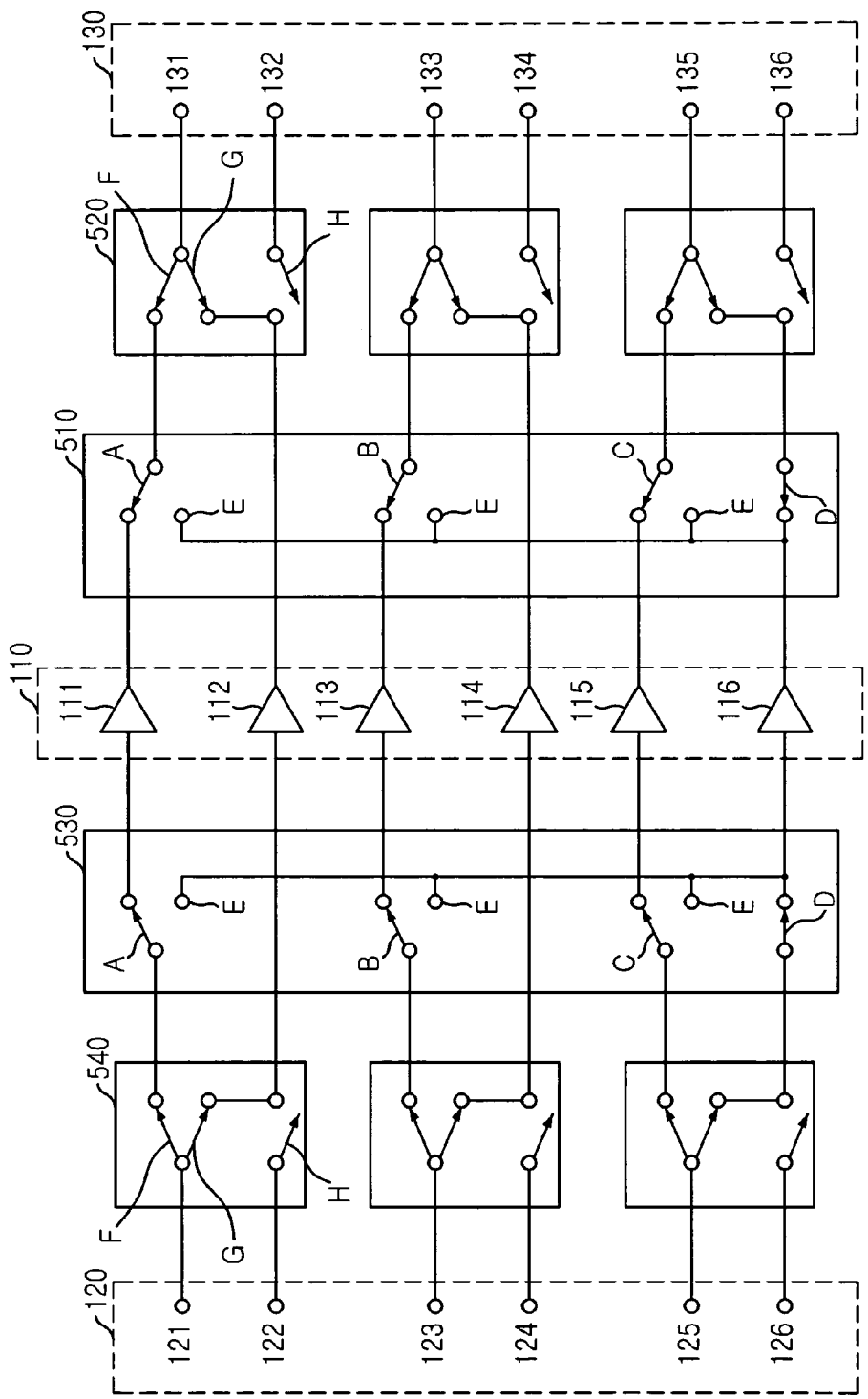
FIG. 6C is a schematic diagram illustrating a dividing/coupling-type operation of the integrated combining apparatus of FIG. 5.

FIGS. 6A to 6C are schematic diagrams describing basic, redundancy and dividing/coupling-type operation of the integrated combining apparatus of FIG. 5.

First, when the integrated combining apparatus is operated in a basic type, as illustrated in FIG. 6A, the switches A, B, C and D of the input 4:4 switch 530 and the output 4:4 switch 510 are all turned on. The switches F and H of the two-way switchable divider 530 and switchable combiner 520 are turned on, while the switch G is turned off. Accordingly, the input port, the power amplifier and the output port are corresponded in the forms of 121-111-131, 122-112-132, 123-113-133, 124-114-134, 125-115-135 and 126-116-136.

When the integrated combining apparatus is operated in a redundancy type, as shown in FIG. 6B, the power amplifiers 111, 113 and 115 are used during normal operation. If one of the power amplifiers performs malfunction, one of the switches A, B and C is connected to an E port, and the reserve power amplifier 116 is operated. Except the switchable dividers and combiners connected to the route where malfunction is made, the switches G and H of the other dividers and combiners are turned off, while the switch F becomes power-on.

Referring to FIG. 6B, it shows malfunction of the power amplifier 111. Here, the switch A is connected to the E port to operate the reserve power amplifier 116, and the switch G of the remaining dividers and combiners, except the switchable dividers and combiners connected to the power amplifier 111 that has performed malfunction, is turned off, and the switches F and H are turned on. Accordingly, signal paths of the input port, power amplifier and output port are corresponded in the forms of 121-116-131, 122-112-132, 123-113-133, 124-114-134 and 125-115-135.

Also, when the integrated combining apparatus is operated in a dividing/coupling type, as illustrated in FIG. 6C, the switches A, B, C and D are all power-on, and the switch H is power-off all the time.

As described above, the outputs of the power amplifiers 111, 112, 113, 114 and 115 are used being combined with the output of the reserve power amplifier 116. When the outputs of the power amplifiers 111 and 112 are not combined and used in one-way, only one of the switches F and G is turned on. For example, if the power amplifier 111 is used, the switch F is turned on, and the switch G is turned off. If the power amplifier 112 is used, the switch F is turned off, and the switch G is turned on.

The present invention can improve the efficiency of system operation, while accommodating the functions of the conventional three types of combiners.

Although 4:4 switches are used as input/output switches in the embodiment of the present invention, it will be obvious to those skilled in the art of the present invention that N:N switches (N being an integer) could be used.

Since the technology of the present invention incorporates all the functions of basic, redundancy and power dividing/coupling types in one combining unit, it can accommodate the increase in subscribers without changing the unit.

While the present invention has been described with respect to certain preferred embodiments, it will be apparent to those skilled in the art that various changes and modifications may be made without departing from the scope of the invention as defined in the following claims.

What is claimed is:

1. A switchable combiner for minimizing route-based disparity in insertion loss, comprising:
   first and second input ports for transmitting inputted signals;
   first and second lines connected to the first and second input ports, respectively, for transmitting the inputted signals;
   a common contact point for combining the signals transmitted from the first and second lines;
   first and second switching means, respectively, for switching the common contact point with the first and second lines based on a number of routes;
   a third line connected between the common contact point and an output port for receiving a signal outputted from the common contact point and transmitting the signal to the output port;
   the output port connected to the third line for outputting the signal transmitted from the third line;
   a third switching means for switching the third line and a short stub;
   an open stub connected to the third line for setting up matching condition with respect to a maximum route number; and
   the short stub for performing matching with respect to route numbers other than the maximum route number,
   wherein an end of the short stub is connected to a ground, and the other end of the short stub is connected to the third line.

2. The switchable combiner as recited in claim 1, wherein an electric length of the third line is obtained from an equation as:

$$L_1[deg] = \tan^{-1} t, \quad t = \frac{X_L \pm \sqrt{R_L[(Z_0 - R_L)^2 + X_L^2]/Z_0}}{R_L - Z_0},$$

where $L_1$ denotes an electric length of the third line.

3. The switchable combiner as recited in claim 1, wherein the electric length of the open stub is obtained from an equation as:

$$L_2[deg] = \tan^{-1}\left(\frac{B_0}{Y_0}\right), \quad B = \frac{R_L^2 t - (Z_0 - X_L t)(X_L + Z_0 t)}{Z_0[R_L^2 + (X_L + Z_0 t)^2]}, \quad B_0 = -B,$$

where $L_2$ denotes an electric length of the open stub,
B denotes a susceptance, and
$B_0$ denotes an open stub susceptance.

4. The switchable combiner as recited in claim 1, wherein the electric length of the open stub is obtained from an equation as:

$$L_3[deg] = -\tan^{-1}\left(\frac{Y_0}{B_S}\right), \quad B = \frac{R_L^2 t - (Z_0 - X_L t)(X_L + Z_0 t)}{Z_0[R_L^2 + (X_L + Z_0 t)^2]}, \quad B_S = -B,$$

where $L_3$ denotes an electric length of the short stub,
B denotes a susceptance, and
$B_s$ denotes a short stub susceptance.

5. The switchable combiner as recited in claim 2, wherein a physical length of the third line, the open stub and the short stub are calculated from an equation as:

$$l_{L1} = \frac{\lambda L_1}{360}, \quad l_{L2} = \frac{\lambda L_2}{360}, \quad l_{L3} = \frac{\lambda L_3}{360} \left(\lambda = \frac{c}{\sqrt{\varepsilon_r} f}\right)$$

where $IL_1$ denotes a physical length of the third line,
$IL_2$ denotes a physical length of the open stub,
$IL_3$ denotes a physical length of the short stub,
$L_1$ denotes a physical length of the third lines,
$L_2$ denotes a physical length of the open stub, and
$L_3$ denotes an electric length of the short stub.

6. An integrated combining apparatus comprising:
   a plurality of switchable dividers connected to an input port for dividing an inputted signal based on a basic, redundancy or power dividing/coupling type of combiner;
   a first N:N switching means (N being an integer) connected between the switchable dividers and a plurality of power amplifiers for receiving signals outputted from the switchable dividers and transmitting the signals to the power amplifiers;
   a second N:N switching means (N being an integer) connected between the power amplifiers and a plurality of switchable combiners for receiving signals outputted from high power amplifiers and transmitting the signals to the switchable combiners; and
   the plurality of switchable combiners connected between the second switching means and an output port for receiving signals outputted from the second N:N switching means and combining the signals based on the basic, redundancy or power dividing/coupling type of combiners,
   wherein the plurality of switchable combiners include:
   first and second input ports for transmitting inputted signals;
   first and second lines connected to the first and second input ports, respectively, for transmitting the inputted signals;
   a common contact point for combining the signals transmitted from the first and second lines;

first and second switching means, respectively, for switching the common contact point with the first and second lines based on a number of routes;

a third line connected between the common contact point and an output port for receiving a signal outputted from the common contact point and transmitting the signal to the output port;

the output port connected to the third line for outputting the signal transmitted from the third line;

a third switching means for switching the third line and a short stub;

an open stub connected to the third line for setting up matching condition with respect to a maximum route number; and the short stub for performing matching with respect to route numbers other than the maximum route number, wherein an end of the short stub is connected to a ground, and the other end of the short stub is connected to the third line.

7. The integrated combining apparatus as recited in claim 6, wherein when the integrated combining apparatus is operated in the basic type, the first and second N:N switches are operated N:N, and each of switchable deviders and combiners has a route number of one.

8. The integrated combining apparatus as recited in claim 6, wherein when the integrated combining apparatus is operated in the redundancy type, the first and second N:N are operated N:(N-1), and each of switchable dividers and combiners has a route number of one.

9. The integrated combining apparatus as recited in claim 6, wherein when the integrated combining apparatus is operated in the dividing/coupling type, the first and second N:N switches are operated N:N, and each of switchable dividers and combiners has a route number of two.

* * * * *